United States Patent
Miwa et al.

(10) Patent No.: US 8,729,663 B2
(45) Date of Patent: May 20, 2014

(54) SEMICONDUCTOR DEVICE

(75) Inventors: Kiyotaka Miwa, Kawasaki (JP); Nayuta Kariya, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 456 days.

(21) Appl. No.: 11/244,161

(22) Filed: Oct. 6, 2005

(65) Prior Publication Data
US 2006/0087002 A1    Apr. 27, 2006

(30) Foreign Application Priority Data

Oct. 26, 2004  (JP) ................................. 2004-311284
Sep. 30, 2005  (JP) ................................. 2005-287792

(51) Int. Cl.
*H01L 23/52*  (2006.01)

(52) U.S. Cl.
USPC ............ 257/529; 257/E23.149; 257/E21.592; 438/132

(58) Field of Classification Search
USPC .......... 257/529, E23.149, 499, 528, E23.141, 257/E23.142, E23.146, E21.536, E21.591, 257/E21.592; 438/132, 128, 601
See application file for complete search history.

(56) References Cited

U.S. PATENT DOCUMENTS

| | | | | |
|---|---|---|---|---|
| 4,723,155 A | * | 2/1988 | Uchida | 257/529 |
| 5,854,510 A | * | 12/1998 | Sur et al. | 257/529 |
| 5,990,537 A | * | 11/1999 | Endo et al. | 257/529 |
| 6,100,118 A | * | 8/2000 | Shih et al. | 438/132 |
| 6,319,758 B1 | * | 11/2001 | Liaw | 438/132 |
| 6,373,120 B1 | * | 4/2002 | Oiyama | 257/529 |
| 6,410,367 B2 | | 6/2002 | Marr et al. | |
| 6,469,354 B1 | * | 10/2002 | Hirata | 257/358 |
| 6,879,023 B1 | * | 4/2005 | Gutierrez | 257/547 |
| 2002/0004932 A1 | * | 1/2002 | Shau | 716/19 |
| 2005/0110070 A1 | * | 5/2005 | Omura | 257/311 |

FOREIGN PATENT DOCUMENTS

| | | |
|---|---|---|
| JP | 64-080037 | 3/1989 |
| JP | 05-063091 | 3/1993 |
| JP | 06-204340 | 7/1994 |
| JP | 10-223762 | 8/1998 |
| JP | 11-233722 | 8/1999 |
| TW | 418521 | 1/2001 |

OTHER PUBLICATIONS

Japanese Official Action mailed Feb. 1, 2011 in corresponding Japanese Application No. 2005-287792 with English translation.
Notice of Reasons for Refusal dated Oct. 16, 2012 issued by Japanese Patent Office in Japanese Patent Application No. 2011-24612, with English translation.

* cited by examiner

*Primary Examiner* — Kenneth Parker
*Assistant Examiner* — John Lin
(74) *Attorney, Agent, or Firm* — Young & Thompson (57) ABSTRACT

On a silicon substrate 120 of a semiconductor device, a field oxide film 101 is provided. On the field oxide film 101, two fuses 104 are provided. Directly below the fuses 104 in the silicon substrate 120, an n-type well 102 is provided. Besides the n-type well 102, a p-type well 103 is provided in such a manner as to surround a region directly under the fuses 104 in the silicon substrate 120. A cover insulating film 108 is provided over the silicon substrate 120 and the field oxide film 101. A seal ring composed of a contact 106 and an interconnection 107 is embedded in the cover insulating film 108 so as to surround the fuses 104.

20 Claims, 10 Drawing Sheets

SEMICONDUCTOR DEVICE

This application is based on Japanese Patent application NOs. 2004-311284 and 2005-287792, the contents of which are incorporated hereinto by reference.

FIELD OF THE INVENTION

The present invention relates to a semiconductor device.

DESCRIPTION OF THE RELATED ART

Recently, semiconductor circuits have began to be used in products such as an automobile that are required to be highly reliable, so that reliable technologies have also began to be required for manufacturing each of factor components of these circuits such as a transistor and an interconnection. A semiconductor is generally manufactured by forming a large number of circuit elements such as a transistor, a resistor, and a capacitor on a semiconductor substrate and interconnecting these elements so as to satisfy required circuit operations and functions. So-called fuses are used in a factor technology for a semiconductor circuit, to cut off a memory circuit on which a fault is found or a redundant circuit resistor. Among them, a laser-trimming fuse is a technique used for such a semiconductor circuit as to require a lot of fuses, by which technique a desired fuse can be cut off by using laser.

Figure 7:
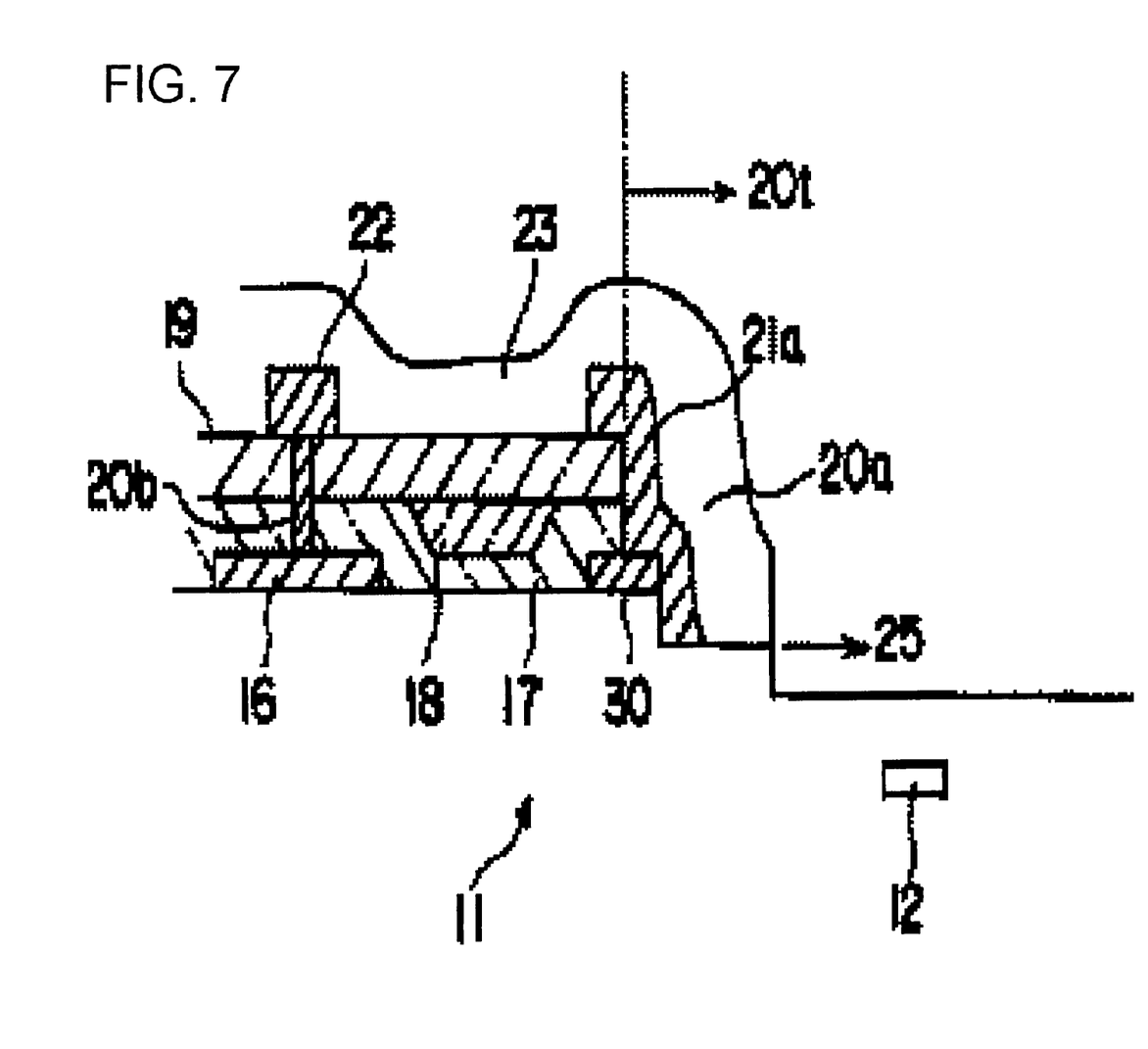
FIG. 7 is a cross-sectional view showing a configuration of a conventionally known semiconductor device.

Japanese Laid-open patent publication No. 10-223762 discloses a semiconductor device having fuse elements that has a construction which inhibits water from percolating through a sidewall of the fuse. FIG. 7 shows a schematic cross-sectional view of a structure of a part of this semiconductor device. In FIG. 7, the device has a silicon substrate that includes a fuse 12 embedded in an insulating interlayer 11 such as a BPSG. A first metal interconnection 16 is generally made of aluminum and patterned using photolithography and etching. The patterned first interconnection 16 is covered by a first insulating film 17. The first insulating film 17 is a silicon oxide film formed using CVD for example.

As shown in FIG. 7, when the patterned first interconnection 16 is covered by the first insulating film 17, a step is generated between the first interconnection 16 and the first insulating film 17. Such a step may contribute to disconnection of, for example, an interconnection arranged on an upper layer in a multilayered interconnection construction. To eliminate the step so that a surface may be flat, a SOG film 18 is deposited as an overcoat film and then etched back. Accordingly, the first insulating film 17 and the SOG film 18 give a flat surface. A second insulating film 19 is formed on the flat surface formed by the first insulating film 17 and the SOG film 18. The second insulating film 19 is a silicon oxide film formed by CDV for example.

On the second insulating film 19 a photoresist (not shown) is applied and exposed to light and selectively removed over regions 20a and 20b, where a through hole is formed. The through-hole forming regions 20a and 20b are located on the fuse 12 and the first interconnection 16 respectively. In the through-hole forming regions 20a and 20b, a through hole opening 20t and a contact hole are formed respectively by etching.

In the region 20a, the second insulating film 19, the SOG film 18, the first insulating film 17, and the insulating interlayer in the substrate are partially etched off, to form the through hole opening 20t in the region 20a located on the fuse 12. In the region 20b, the second insulating film 19 and the first insulating film 17 are removed, to form a through hole for multilayered interconnection.

In such a manner, the through hole opening 20t is formed in the region 20a located on the fuse 12. Further, contact hole for the multilayered interconnection is formed on the first interconnection 16, second metal sputtered on inner sides and exposed surfaces of the through hole opening 20t. And the second metal is selectively patterned using photolithography and etching processing, to form a metal sidewall portion 21a and a second interconnection 22. Aluminum is used to make the second metal that constitutes the metal sidewall portion 21a and the second interconnection 22. Further, a passivation film 23 is deposited all over the surface as a cover film by using CVD. Then, the passivation film 23 located over the fuse 12 is removed by dry etching.

According to this configuration, over the fuse 12 a cover opening 25 is formed as a fuse opening. When the cover opening 25 is formed, the insulating interlayer 11, which is a part of the substrate, is also etched off partially to such an extent that part of insulating interlayer 11 left unremoved can be easily removed by laser.

As described above, in this semiconductor device, the SOG film 18, which is highly water absorbing, is covered by the same metal as the second interconnection 22 and further covered by the passivation film 23. Japanese Laid-open patent publication No. 10-223762 describes that the SOG film 18 is covered doubly by the metal sidewall portion 21a and the passivation film 23, so that water is inhibited from percolating into the SOG film 18.

However, although by the conventional technologies described in the above Japanese Laid-open patent publication No. 10-223762 it is possible to inhibit percolation of, for example, water from a portion between the first interconnection 16 and the second interconnection 22 and from the cover opening 25 outside the metal sidewall portion 21a, it is difficult by these technologies to inhibit percolation of water, a metal ion, and an organic matter from a portion of the fuse 12 damaged by fuse trimming. The water, the metal ion, or the organic matter that has thus percolated through the damaged portion may degrade properties of the first interconnection 16, the second interconnection 22, and other elements (not shown). Accordingly, these conventional technologies described in the above Japanese Laid-open patent publication No. 10-223762 are yet to be improved in terms of reliabilities.

SUMMARY OF THE INVENTION

According to the present invention, there is provided a semiconductor device which comprises a semiconductor substrate; an insulating layer provided on the semiconductor substrate; a fuse provided on the insulating layer; and an n-type well provided directly below the fuse in the substrate.

By this configuration, a negatively charged n-type well can capture positively charged water, metal ions, and organic matters that may percolate from a portion where the fuse is removed after the fuse trimming. It is thus possible to inhibit the water, metal ions, or organic matters that have percolated from a damaged portion of an insulating layer from percolating to an outside of the n-type well when melting the fuse by laser irradiation. Accordingly, by arranging circuit elements outside the n-type well, it is possible to prevent degradation in functionality of the circuit elements. By this configuration, therefore, a semiconductor device having an excellent reliability can be obtained.

The present invention provides a semiconductor device which comprises a semiconductor substrate; an insulating layer provided on the semiconductor substrate; a fuse provided on the insulating layer; and a p-type well provided so as to surround a region directly below the fuse in the substrate.

By this configuration, a potential of a positively charged p-type well can thrust back positively charged water, metal ions, and organic matters that may percolate from a portion where the fuse is removed after the fuse trimming. It is thus possible to inhibit the water, metal ions, or organic matters that have percolated from a damaged portion of an insulating layer from percolating to an outside of the p-type well when melting the fuse by laser irradiation. Accordingly, by arranging circuit elements outside the p-type well, it is possible to prevent degradation in functionality of the circuit elements. By this configuration, therefore, a semiconductor device having an excellent reliability can be obtained.

The present invention provides a semiconductor device that has an excellent reliability because it has a special well structure below a fuse.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE INVENTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

In a semiconductor device according to the present invention, the above-described n-type well can be configured so as to come into contact with a lower surface of the insulating layer. By this configuration, also when melting the fuse by laser irradiation, water, metal ions, organic matters, for example, that have percolated from a damaged portion of, for example, the insulating layer can be captured efficiently by the n-type well.

In the semiconductor device according to the present invention, further an upper insulating film may be provided over the semiconductor substrate and the insulating layer and a seal ring embedded into the upper insulating film so as to surround the fuse. By this configuration, since the seal ring is embedded into the upper insulating film so as to surround the fuse, it is possible to inhibit water, metal ions, organic matters, for example, from percolating through the upper insulating film into a circuit element region provided around the fuse.

In the semiconductor device according to the present invention, the above-described p-type well can be configured to come into contact with a lower surface of the seal ring. By this configuration, the p-type well and the seal ring can be unified, to efficiently inhibit water, metal ions, organic matters, for example, from percolating into the circuit element region provided around the fuse.

In the semiconductor device according to the present invention, the above-described insulating layer may be made of an element separation film embedded on the element formation surface side of the semiconductor substrate. By this configuration also, a particular well structure is provided below the fuse, so that when melting the fuse by laser irradiation, it is possible to inhibit water, metal ions, organic matters, for example, that have percolated from a damaged portion of for example, the insulating layer from percolating to an outside of the well structure.

In the semiconductor device according to the present invention, a protection insulating film may further be provided so as to cover an upper surface of the above-described fuse. By this configuration, the protection insulating film covers the upper surface of the fuse to inhibit percolation of water, metal ions, organic matters and the like, to enable inhibiting these from percolating into a region under the fuse.

The following will describe embodiments of the present invention with reference to drawings. It is to be noted that similar components are indicated by similar symbols and detailed explanation thereof is not described appropriately.

First Embodiment

Figure 1:
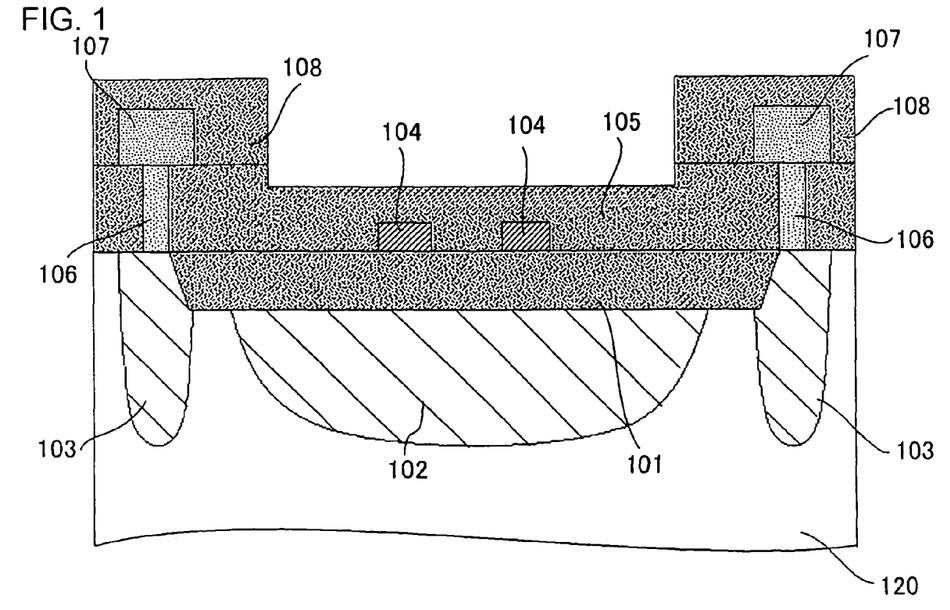
FIG. 1 is a cross-sectional view showing a configuration of a laser-trimming fuse used in the present embodiment.

FIG. 1 is a cross-sectional view of a configuration of a laser-trimming fuse used in the present embodiment.

A semiconductor device according to the present embodiment comprises a p-type silicon substrate 120 (semiconductor substrate). On the silicon substrate 120, a field oxide film 101 (insulating layer) is provided. The field oxide film 101 is an element separation film (STI) made of an $SiO_2$ film embedded on the element formation surface side of the silicon substrate 120. On the field oxide film 101, two fuses 104 are provided.

In the silicon substrate 120, an n-type well 102 is provided directly below the fuses 104. The n-type well 102 is configured so as to come into contact with a lower surface of the field oxide film 101. A p-type well 103 is provided in such a manner as to surround a region directly below the fuses 104 in the silicon substrate 120.

An impurity concentration of the p-type well 103 is larger than that of the other p-type regions in the silicon substrate 120.

Although the present embodiment has employed a p-type substrate as the semiconductor substrate, the present invention is not limited to this; an n-type substrate (for example, n-type silicon substrate) may be employed as the semiconductor substrate.

In a case where an n-type semiconductor substrate is used as the semiconductor substrate, the n-type well only needs to have a larger impurity concentration than the other n-type regions.

On the silicon substrate 120 and the field oxide film 101, an insulating film 105 is provided. The insulating film 105 is provided to cover upper surfaces of the fuses 104. In this insulating film 105, a contact 106 is embedded so as to surround the fuses 104. Namely, the insulating film 105 functions as a protection insulating film and a portion of an upper insulating film.

On the insulating film 105, a cover insulating film 108 (a portion of the upper insulating film) is provided. The cover insulating film 108 is provided so as to surround the fuses 104. The upper insulating film comprises the cover insulating film 108 and a portion of the insulating film 105. In this cover insulating film 108, an interconnection 107 is embedded so as to surround the fuses 104. A seal ring is comprised of the contact 106 and the interconnection 107. The p-type well 103 is configured so as to come into contact with a lower surface of the seal ring.

Directly above the fuses 104, the cover insulating film 108 and the insulating film 105 are removed partially, to form a fuse opening. It is to be noted that for example, an oxide film, a nitride film, or an oxy-nitride film may be formed as the insulating film 105. A nitride film and an oxy-nitride film, in particular, have an elaborate film quality and so have a high functionality as the insulating film 105.

Figure 2:
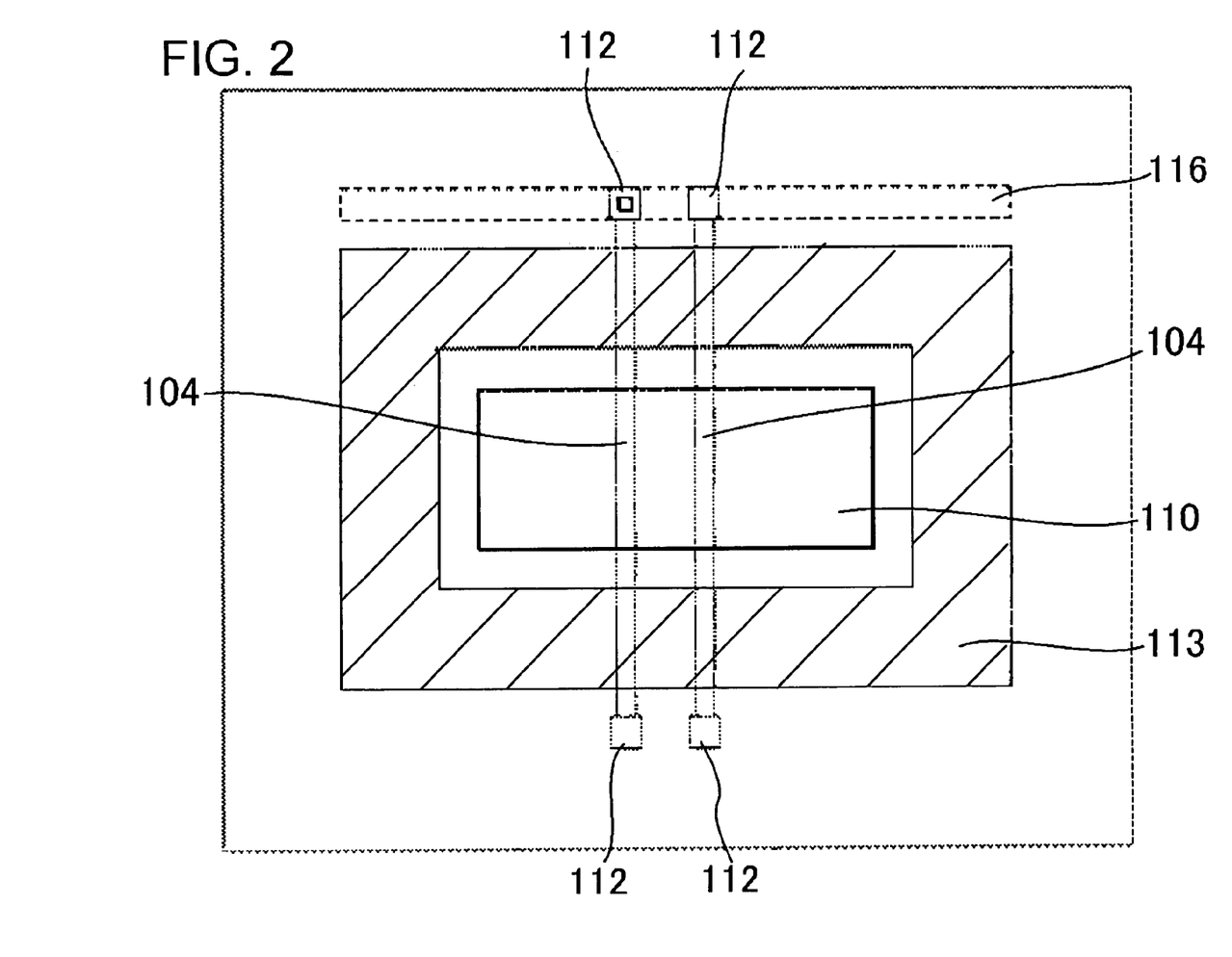
FIG. 2 is a plan view showing the configuration of the laser-trimming fuse used in the present embodiment.

FIG. 2 is a plan view of the configuration of the laser-trimming fuse used in the present embodiment.

The semiconductor device according to the present invention comprises the two fuses 104 made of a polysilicon film. The fuse 104 in the present embodiment has such a structure that a narrow midsection thereof may be melt by laser irradiation to disconnect interconnections. Each of the interconnections is connected with the end of the fuse 104. Therefore, the fuse is made of a high melting point metal film made of, for example, polysilicon, Ta, TaN, tungsten, or tungsten silicide, which easily absorbs laser and has an excellent conductivity.

A region exposed to laser irradiation, which is a midsection of these fuses 104, may be set to a small line width of, for example, 0.5 μm-1.6 μm. The both ends 112 of the fuse 104 have a larger width than that of the region exposed to laser irradiation and are connected to copper interconnect lines 116 (only one of which is shown) provided in the silicon substrate (not shown) directly below them.

Also, where the polysilicon-made midsection of the fuse 104 has a smaller film width, a fuse opening 110 (fuse window) is provided where the cover insulating film (not shown) does not exist. Further, a seal ring 113 composed of the metal-made contact 106 and the interconnection 107 is provided in the cover insulating film 108 (not shown) and the insulating film 105 so as to surround the fuses 104.

Such a semiconductor device is manufactured as follows:

The field oxide film 101 is formed on the silicon substrate 120.

Next, by using a photoresist (not shown) patterned by photolithography as a mask (not shown), the n-type well 102 is formed under the field oxide film 101 by ion implantation. Next, by the same method as for the n-type well 102, the p-type well 103 is formed so as to surround the n-type well 102.

Then, on the field oxide film 101, a polysilicon film is formed and patterned by photolithography and etching into a desired shape to form fuses 104 made of polysilicon film.

Further, the insulating film 105 is formed so as to cover the fuses 104. Then, a (ring-shaped as viewed from the top) trench is formed in the insulating film 105. In this trench, the contact 106 is formed, and over the contact 106 the interconnection 107 is formed. The cover insulating film 108 is formed so as to cover the interconnection 107 and the insulating film 105. Then, above the fuses 104, the insulating film 105 and the cover insulating film 108 are removed by dry etching. Accordingly, the laser-trimming opening 110 is formed above the fuses 104.

The following will describe actions and effects of a semiconductor device according to the present invention.

The semiconductor device according to the present invention has an excellent reliability. That is, the semiconductor device according to the present invention comprises the fuses 104 subject to laser trimming, so that positively charged water, metal ions, organic matters, for example, that may percolate from a portion of the fuse 104 removed by fuse trimming can be captured by the negatively charged n-type well 102.

This may be detailed as follows: when the fuse 104 is melt, water, for example, may percolate through the damaged field oxide film 101 into the silicon substrate 120.

Further, generally, semiconductor circuits are sealed by a thermosetting resin such as an epoxy, molded, and heat-treated to be protected from external environments. Since the thermosetting resin contains water, metal ions, and organic matters somewhat, they may get through a removed portion of the fuse 104 and percolate into the silicon substrate 120.

By the present embodiment, it is possible to capture the water, metal ions, and organic matters that have percolated into the silicon substrate 120, by using the negatively charged n-type well 102.

It is also possible to thrust back positively charged water, metal ions, organic matters, for example, that may percolate through a removed portion of the fuse 104, by using a potential of the positively charged p-type well.

Furthermore, the seal ring 113 is embedded into the cover insulating film 108 and the insulating film 105, so that it is possible to inhibit water, metal ions, organic matters, for example, from passing through the cover insulating film 108 and the insulating film 105, and percolating into the circuit element region provided around the fuses 104.

Accordingly, also when the fuses 104 are melt by laser irradiation, it is possible to inhibit water, metal ions, organic matters, for example, that have percolated from a damaged portion of the field oxide film 101, for example, from percolating to an outside of the p-type well 103. It is thus possible to suppress degradation in functionality of the circuit elements by arranging the circuit elements to the outside of the p-type well 103. By this configuration, therefore, a semiconductor device having an excellent reliability can be obtained.

Second Embodiment

A configuration of a semiconductor device according to the present embodiment is basically the same as that of the semiconductor according to the first embodiment, except that the semiconductor device according to the present embodiment employs a seal ring composed of a two-step contact and a two-step interconnection as described later.

The following will describe steps of manufacturing the semiconductor device according to the present embodiment.

Figure 3A:
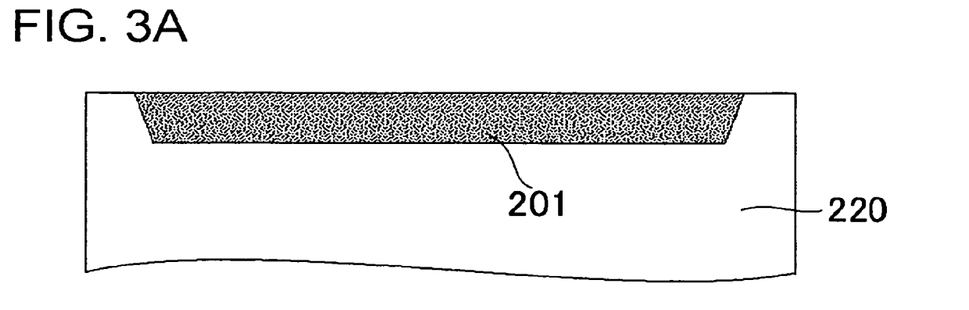
FIGS. 3A to 3C are process cross-sectional views showing a method of manufacturing a semiconductor device according to the present embodiment in order of its manufacturing steps.
Figure 3B:
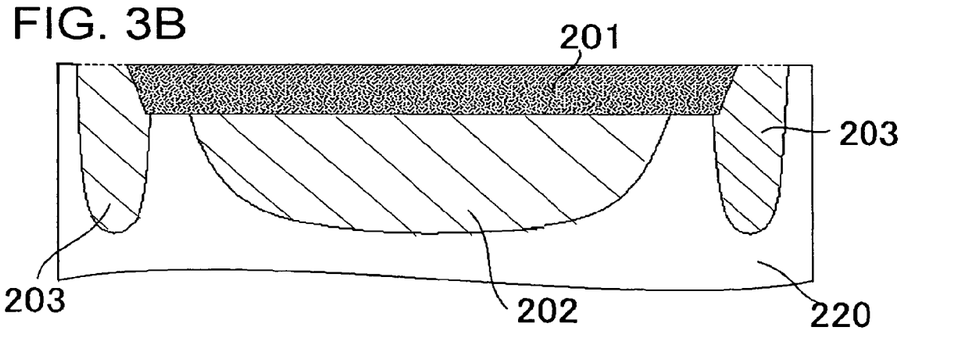
Figure 3C:
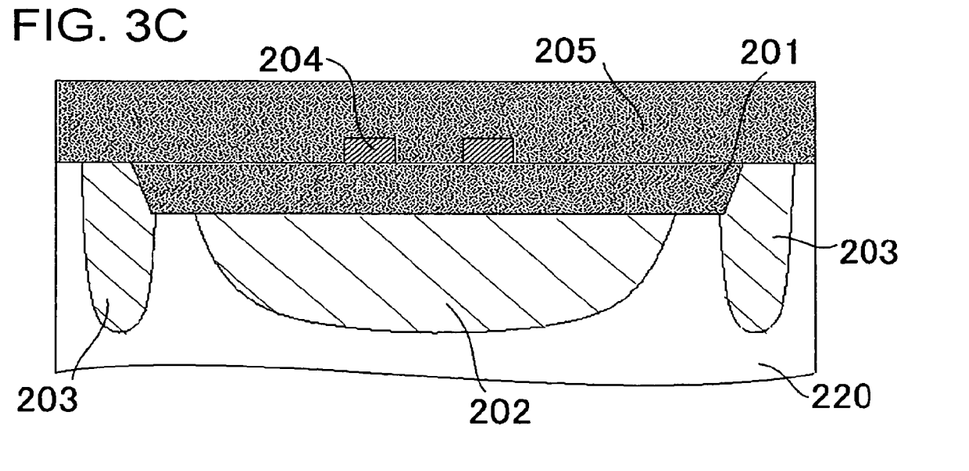

FIGS. 3A to 3C are process cross-sectional view showing a method of manufacturing the semiconductor device according to the present embodiment in order of its manufacturing steps. First, as shown in FIG. 3A, on a silicon substrate 220, a field oxide film 201 is formed in a fuse element portion in order to electrically insulate device elements from each other.

This field oxide film 201 can be formed by the same process as that of the other field oxide films that define a circuit element region.

Next, as shown in FIG. 3B, by using a photoresist (not shown) patterned by photolithography as a mask (not shown), an n-type well 202 is formed under the field oxide film 201 by ion implantation. The patterned photoresist (not shown) is removed by assign or wet etching. Next, by the same method as for the n-type well 202, a p-type well 203 is formed so as to surround the n-type well 202, to remove the photoresist (not shown) similarly. In this case, the p-type well 203 is formed ring shaped as viewed from the top on a surface of a silicon substrate 220 in which elements are formed.

It is to be noted that the n-type well 202 and the p-type well 203 can be formed by the same process as that for an n-type well and a p-type well formed in a circuit element region.

Next, as shown in FIG. 3C, on the field oxide film 201, a polysilicon film is formed and patterned by photolithography and etching into a desired shape to form two fuses 204 made of polysilicon film. Besides a polysilicon film, the fuses 204 can be used a high melting point metal film made of, for example, Ta, TaN, tungsten, or tungsten silicide. On the fuses 204, an insulating interlayer 205 (which functions also as a protection insulating film and a upper insulating film) made of BPSG is formed. As a result, the fuses 204 are embedded in the insulating interlayer 205.

Figure 4A:
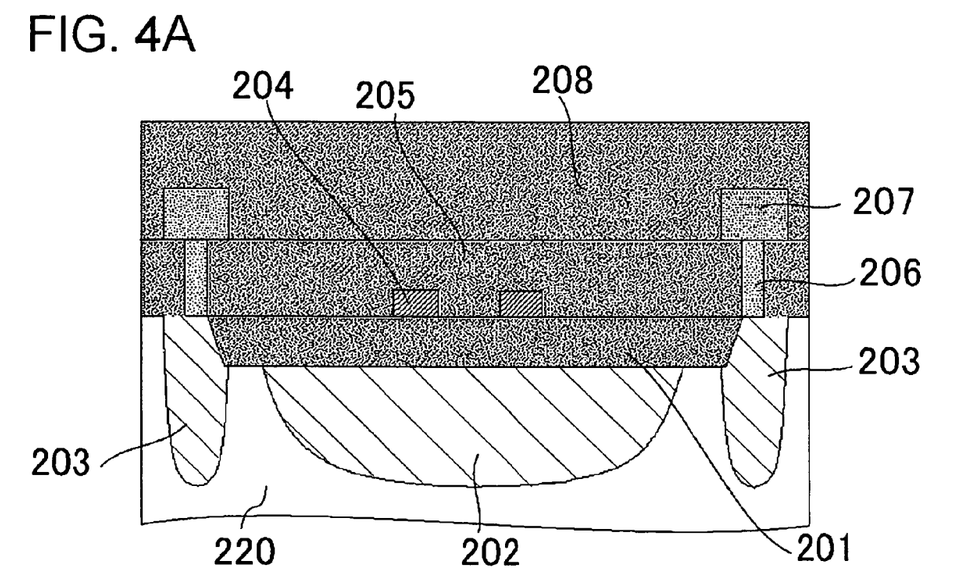
FIGS. 4A and 4B are additional process cross-sectional views showing the method of manufacturing the semiconductor device according to the present embodiment in order of its manufacturing steps.
Figure 4B:
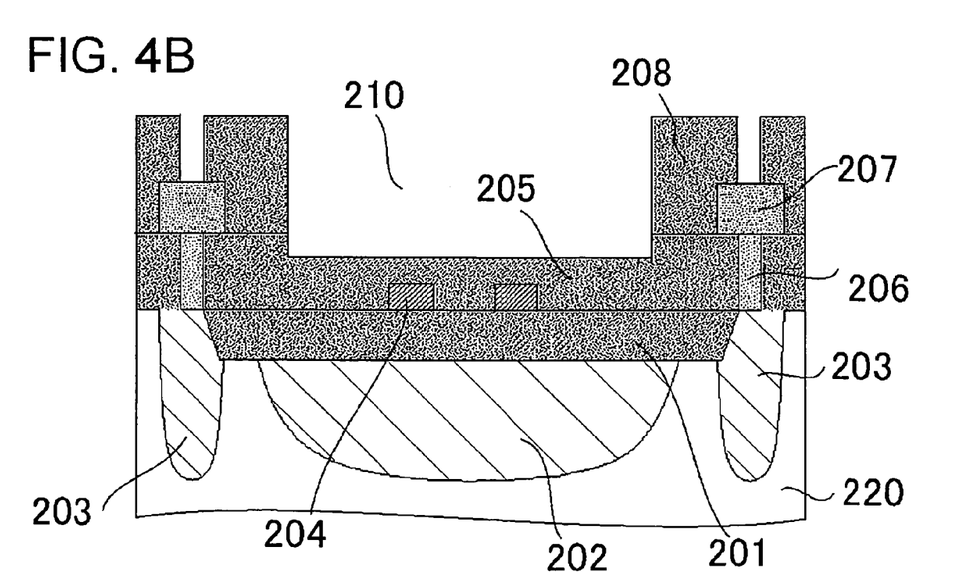

FIG. 4 are additional process cross-sectional views for showing the method of manufacturing the semiconductor device according to the present embodiment in order of its manufacturing steps. Next, as shown in FIG. 4A, the insulating interlayer 205 is patterned by photolithography and etching to obtain a (ring-shaped as viewed from the top) trench which encircles the fuses 204. Further, in this ring-shaped trench, a contact plug 206 is formed which is constituted of a barrier metal film made of, for example, titanium and a tungsten film provided in the barrier metal film. Next, an aluminum film is formed on the insulating interlayer 205 and patterned by photolithography and etching into a first interconnection 207 that covers the contact plug 206. The first interconnection 207 is made of aluminum. Next, the first interconnection 207 is covered by an insulating oxide film 208.

Next, as shown in FIG. 4B, a ring-shaped region of the insulating oxide film 208 (a portion of upper insulating film) directly on the first interconnection 207 is patterned by photolithography and removed by dry etching, to obtain a ring-shaped trench. In this ring-shaped trench, a first via 209 (see FIG. 5) is formed on the first interconnection 207. On the other hand, by the same dry etching as that for obtaining the above-described ring-shaped trench, a laser-trimming opening 210 is formed above the fuses 204.

Then, as described later with reference to FIG. 5, similarly, an aluminum film is formed on the insulating oxide layer 208 and patterned by photolithography and dry etching into a second interconnection 211 that covers the first via 209. The second interconnection 211 is made of aluminum. Next, the second interconnection 211 is covered by an insulating oxide film 212 (a portion of upper insulating film). Further, a top-layer insulating oxide film 213 is formed on an upper surface of the insulating oxide film 212.

In this case, furthermore, the insulating oxide films 213 and 212 directly above the fuses 204 are patterned by photolithography and removed by dry etching, to form the laser-trimming opening 210 again above the fuses 204.

In this case, it is preferable to adjust a thickness of the insulating interlayer 205, which is an oxide film above the fuses 204, to such a value that the fuses 204 can be melt by laser easily. It is to be noted that although in the present embodiment, for easy explanation, the fuse opening 210 has been formed by the same process as that for forming the ring-shaped trench for the first via 209, the present invention is not limited to it; it may be formed by a different process. For example, after the insulating oxide film 213 is formed, the insulating oxide films 213, 212, and 208 and the insulating interlayer 205 directly above the fuses 204 may be patterned by photolithography and removed by dry etching, to form the laser-trimming opening 210 above the fuses 204.

Figure 5:
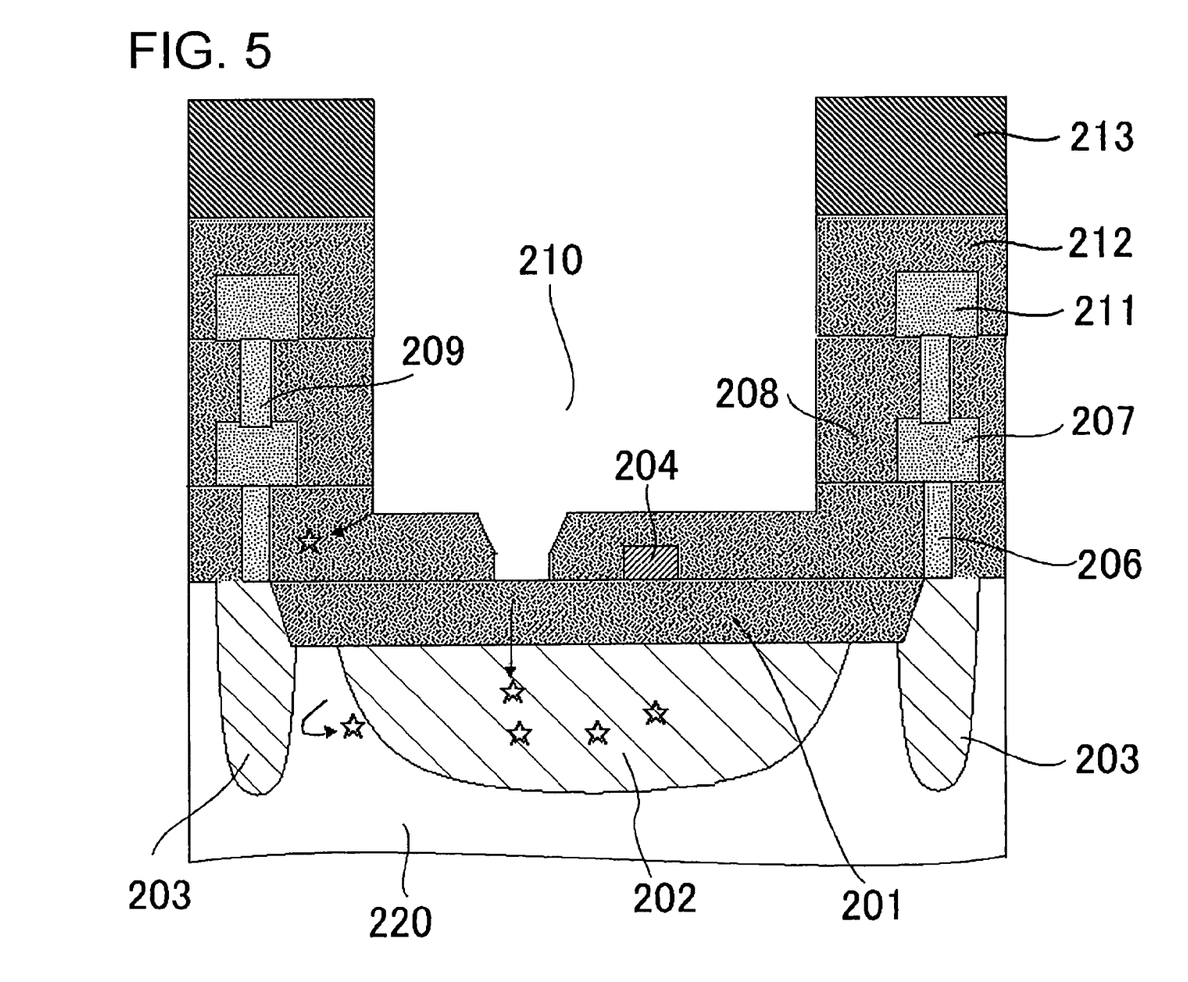
FIG. 5 is a cross-sectional view showing a configuration after the laser-trimming fuse used in the present embodiment is trimmed.
Figure 6:
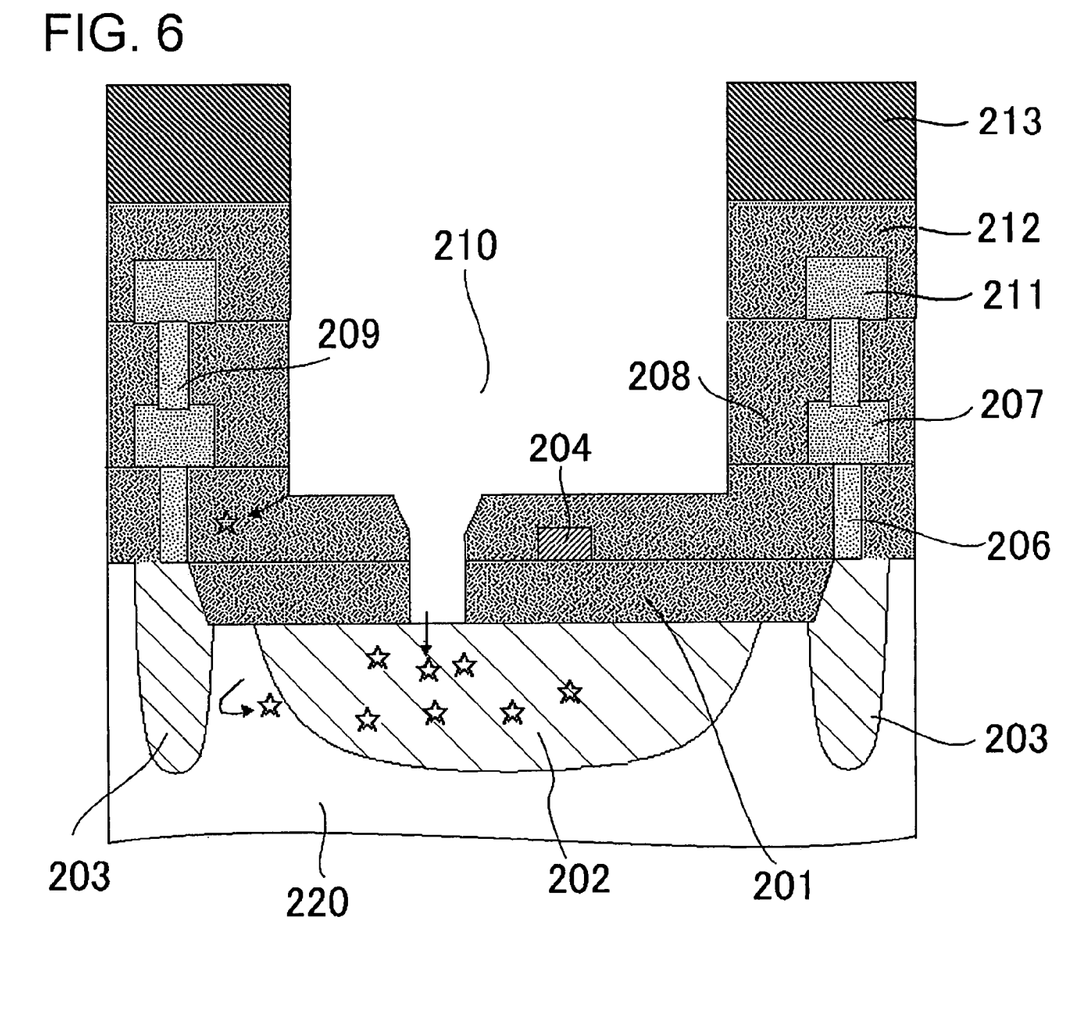
FIG. 6 is another cross-sectional view showing the configuration after the laser-trimming fuse used in the present embodiment is trimmed.

FIGS. 5 and 6 are cross-sectional views of a configuration after the laser-trimming fuse used in the present embodiment is trimmed.

The semiconductor device according to the present invention is also excellent in reliability similar to that according to the first embodiment. That is, in the semiconductor device according to the present embodiment, as shown in FIG. 5, positively charged water, metal ions, organic matters, for example, that have percolated from a portion where the fuses 204 are removed by laser are captured by the negatively charged n-type well 202. Further, even if positively charged water, metal ions, organic matters, for example, have percolated to the outside of the n-type well 202, the positively charged water, metal ions, organic matters, for example, are brought back to the n-type well 202 owing to a difference in potential between the negatively charged n-type well 202 and the positively charged p-type well 203. Accordingly, the water, metal ions, organic matters, for example, are inhibited from percolating to semiconductor elements arranged outside the p-type well 203.

Further, by surrounding the fuses 204 by the contact plug 206 constituted of a barrier metal made of, for example, titanium and a tungsten film provided in the barrier metal film, it is possible to inhibit the above-described water, metal ions, organic matters, for example, from percolating from a lower surface of the first interconnection 207. Therefore, by arranging, for example, circuit elements outside the p-type well 203, it is possible to suppress degradation in functionality of the circuit elements. By this configuration, therefore, a semiconductor excellent in reliability can be obtained.

It is to be noted that the silicon substrate 220 is typically grounded in potential.

Further, melting of the fuses 204 by use of laser irradiation is performed by heating and damaging the polysilicon film of the fuses 204. Therefore, when the fuses 204 are melt, the field oxide film 201 may be damaged and removed as shown in FIG. 6. In such a case, since the fuses 204 and the field oxide film 201 are removed, positively charged water, metal ions, and organic matters easily percolate into the silicate substrate. However, the positively charged water, metal ions, and organic matters are captured by the negatively charged n-type well 202. Further, even if positively charged water, metal ions, organic matters, for example, have percolated to the outside of the n-type well 202, the positively charged water, metal ions, organic matters, for example, are brought back to the n-type well 202 owing to a difference in potential between the negatively charged n-type well 202 and the positively charged p-type well 203. It is thus possible to suppress degradation in functionality of the circuit elements arranged outside the p-type well.

In such a manner, the present invention works especially in a case where a fuse is melt by laser irradiation.

Further, in the present embodiment, a seal ring constituted of two contact plugs and two interconnections is used, so that it is possible to further securely inhibit water, metal ions, organic matters, for example, from percolating to a circuit element region arranged around the fuse 104.

The semiconductor device according to the present embodiment is excellent in manufacturing stability. That is, according to a configuration of the semiconductor device according to the present embodiment, it is possible to load a laser-trimming fuse element especially, for example, into a high-quality, vehicle-installed semiconductor device which operates in a severe environment and whose defective fraction is required to be 1ppm or less. The present configuration, in which the fuses 204 are provided on the field oxide film 201 on the silicon substrate 220, is excellent in combination with a basic CMOS transistor manufacturing process. It is, therefore, possible to form the fuses 204 without adding any manufacturing process to the basic CMOS transistor manufacturing process, thereby further enhancing added values of the high-quality semiconductor device. The present invention, therefore, can be easily applied to a variety of configurations of semiconductor devices, thereby improving manufacturing stability of semiconductors including reduction in rejection in the market and improvements in yield thereof.

Reference Example

The following will describe a reference example in order to make actions and effects of the present embodiments more clear through comparison between these embodiments and the reference example.

Figure 8:
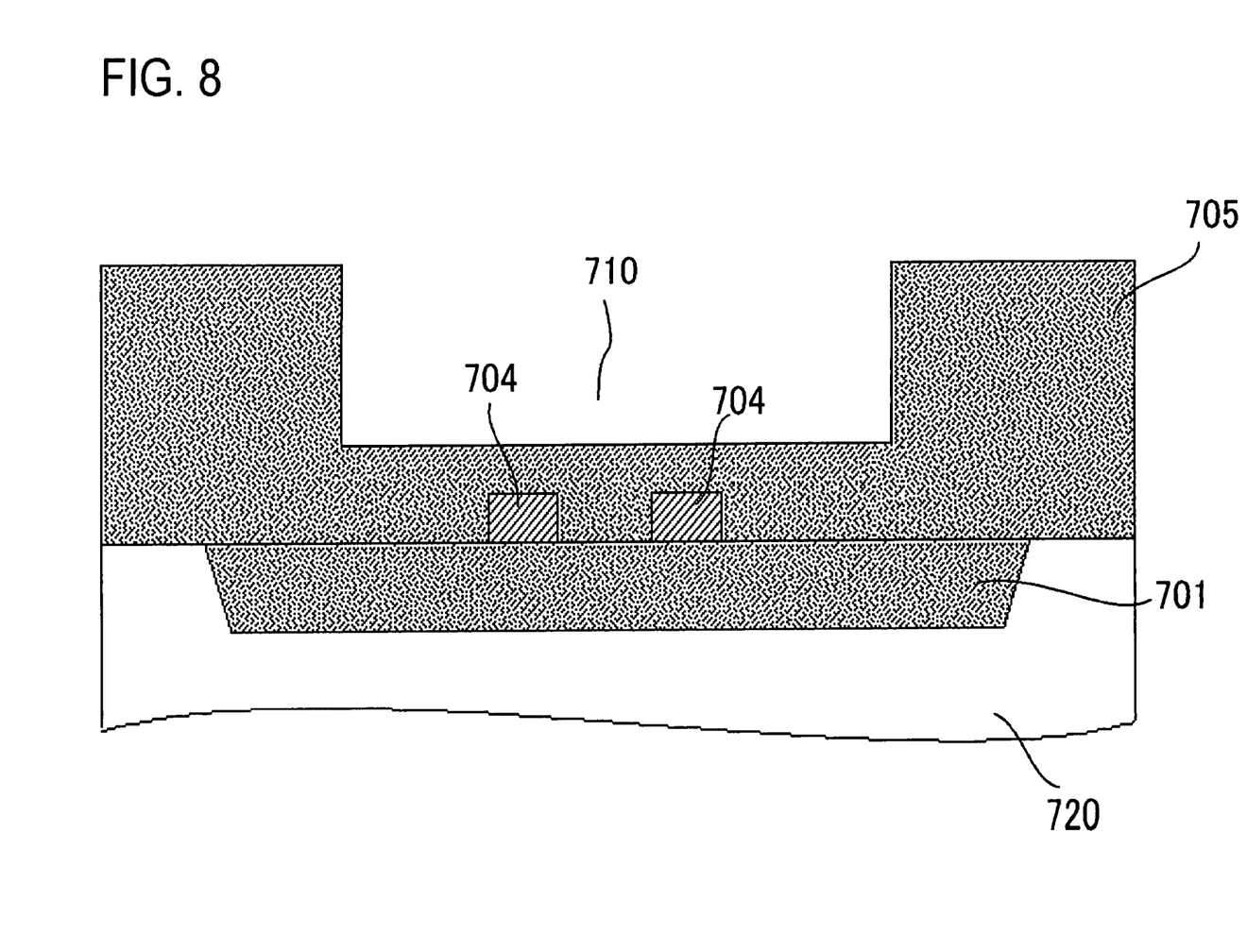
FIG. 8 is a cross-sectional view showing a configuration of a laser-trimming fuse used in a reference example.

FIG. 8 is a cross-sectional view of a configuration of a laser-trimming fuse used in the reference example. In this laser-trimming fuse structure, a fuse 704 made of generally polysilicon is formed on a field oxide film 701, and a protection oxide film 705 is formed thereon. Further, a fuse opening 710 is formed by removing the protection oxide film 705 on the fuses 704 through dry etching to a desired film thickness so that the fuses 704 can be melt easily.

It is to be noted that no well is provided in a silicon substrate below the fuses.

Figure 9:
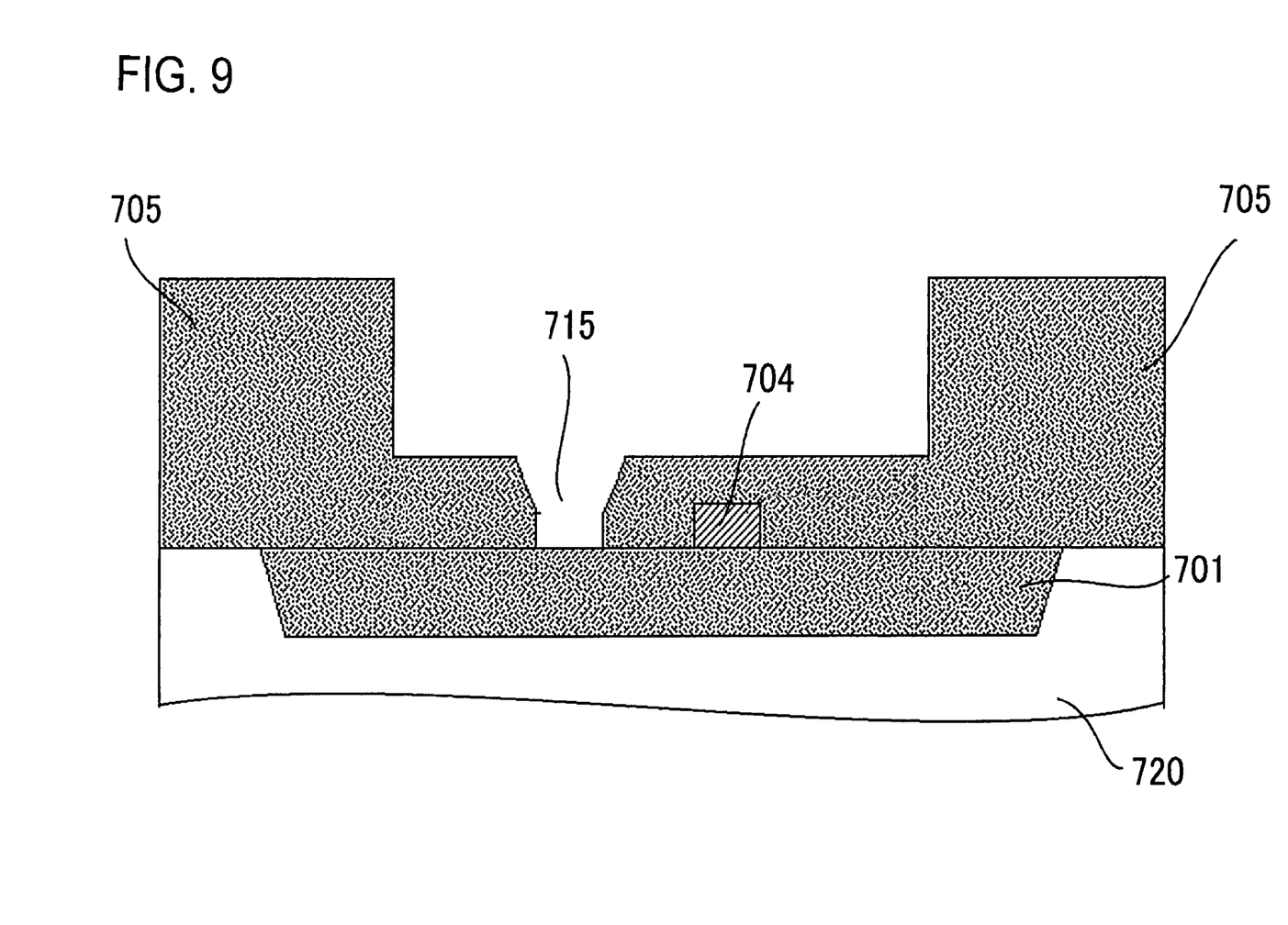
FIG. 9 is a cross-sectional view showing a configuration after the laser-trimming fuse used in the reference example is trimmed.
Figure 10:
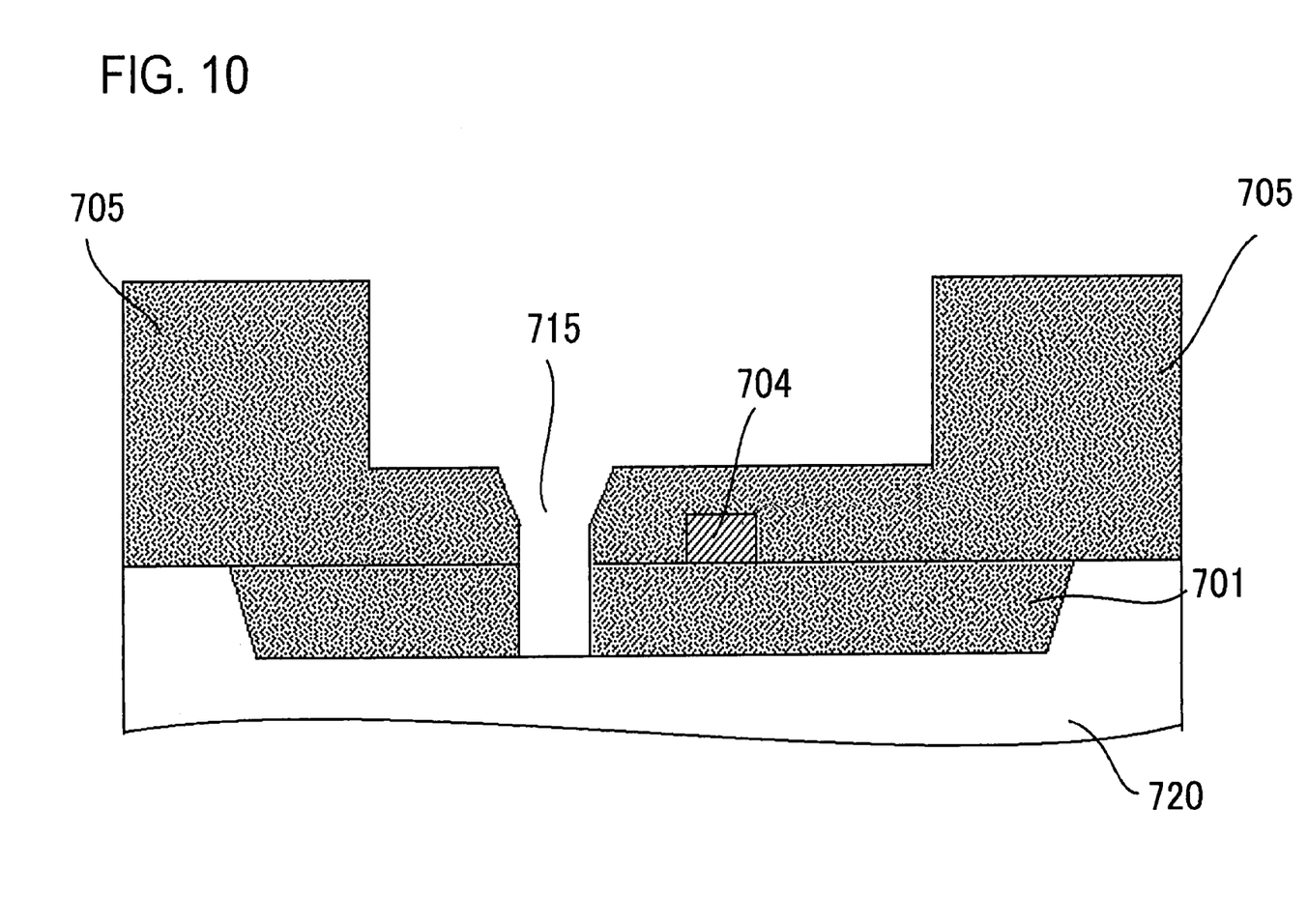
FIG. 10 is another cross-sectional view showing the configuration after the laser-trimming fuse used in the reference example is trimmed.

FIGS. 9 and 10 are cross-sectional views of a configuration after the laser-trimming fuse used in the reference example is trimmed. In FIG. 9, a damaged portion 715 given after the fuse 704 is trimmed (removed) has such a structure that the fuse 704 and a portion of the protection oxide film 705 thereon are removed and, therefore, is opened down to the field oxide film 701.

Further, in FIG. 10, a portion of the field oxide film 701 under the fuse 704 is also damaged and removed.

Generally, semiconductor circuits are sealed by a thermosetting resin such as an epoxy, molded, and heat-treated to be protected from external environments. Generally, the thermosetting resin before molding contains water, metal ions, and resin somewhat. In the structure shown in FIG. 9, the damaged portion 715 given after the fuse 204 is removed has a smaller thickness of the protection oxide film 705 than the other portions. Therefore, when the fuse opening 710 is filled with the thermosetting resin thereafter, a distance between a silicon substrate 720 and the thermosetting resin at the damaged portion 715 is smaller than those at the other portions. In this case, it is difficult to capture the water, metal ions, and organic matters from the heat-hardening resin by using the protection oxide film 705 at the damaged portion 715.

Further, in a case where the field oxide film 701 under the fuse 704 is completely removed as shown in FIG. 10, the water, metal ions, and organic matters from the thermosetting resin are more easily to percolate into the silicon substrate.

In the present reference example, since no well is provided below the removed fuse 704, if the silicon substrate is a p-type one, the water, metal ions, and organic matters that have percolated into the silicon substrate cannot be captured. Even in a case where the silicon substrate is an n-type one, since no well is formed and the substrate has a uniform potential everywhere therein, the water, metal ions, and organic matters that have percolated into the silicon substrate cannot be captured. Therefore, the water, metal ions, and organic matters are liable to reach a circuit element region. The percolation of the water, metal ions, and organic matters causes malfunctioning of a semiconductor device and deteriorates its reliability.

Furthermore, a sidewall of the fuse opening 710 is not covered by a protection nitride film. Further, no seal ring is provided deep in the sidewall of the fuse opening 710. Therefore, there is a slight possibility that laser irradiation may damage the protection oxide film 705 at the sidewall so that its function as a protection film may be deteriorated.

In contract, in the semiconductor devices according to the above-described embodiments, a particular well structure directly below the fuses and a seal ring enable inhibiting organic matters, metal ions, and water from, for example, sealing resin in contact with the fuse opening subject to trimming from percolating into a region of semiconductor elements. It is thus possible to provide a fuse structure that can secure a high reliability for, for example, a vehicle-installed semiconductor device.

Although the embodiments of the present invention have been described with reference to the drawings, they are just examples of the present invention, so that a variety of configurations other than the above can be employed.

For example, in the above embodiments, materials of the cover insulating film 108, the insulating film 105, the insulating interlayer 205, and the insulating oxide films 208, 212, and 213 are not limited in particular; for example, an $SiO_2$ film, an SiN film, or an SiON film can be used optimally. By using an SiN film or an SiON film in particular, a merit which improves waterproof properties of the insulating films themselves may be obtained.

Furthermore, although in the above embodiments both an n-type well and a p-type well have been formed in a silicon substrate, only one of them may be formed instead.

It is apparent that the present invention is not limited to the above embodiment, that may be modified and changed without departing from the scope and spirit of the invention.

What is claimed is:

1. A semiconductor device comprising:
a p-type semiconductor substrate;
a field oxide film embedded in said p-type semiconductor substrate;
a fuse provided on said field oxide film;
a single n-type well provided directly below said fuse in said p-type semiconductor substrate, wherein said single n-type well is provided only below a lowest most surface of the field oxide film and completely within a vertical boundary defined by each end of said field oxide film;
a p-type well provided in such a manner as to surround a region directly under said fuse in said p-type semiconductor substrate and having a larger impurity concentration than an impurity concentration of said p-type semiconductor substrate;
a first insulating layer and a second insulating layer in this order stacked over said p-type semiconductor substrate and said field oxide film;
a seal ring embedded in said first insulating layer and said second insulating layer so as to surround said fuse; and an opening provided over said single n-type well so as to expose the first insulating layer, wherein said first insulating layer covers an upper surface of said fuse, wherein said p-type well is in contact with a lower surface of said seal ring, and said single n-type well and said p-type well being free of an impurity layer therebetween.

2. The semiconductor device according to claim 1, wherein said single n-type well is in contact with a lower surface of said field oxide film.

3. The semiconductor device according to claim 1, wherein said field oxide film is an element separation film embedded on an element formation surface side of said p-type semiconductor substrate.

4. The semiconductor device according to claim 1, wherein said field oxide film is a single insulating layer.

5. The semiconductor device according to claim 4, wherein said single insulating layer is comprised of a $SiO_2$ film.

6. The semiconductor device according to claim 1, wherein said p-type well and said single n-type well extend to a same depth in said p-type semiconductor substrate.

7. The semiconductor device of claim 1, wherein,
the fuse has an overall elongated structure with two ends with an interconnection connected to each end of each fuse, the fuse made of a film shaped to have a narrow midsection configured to be melted by laser irradiation to disconnect the interconnections,
the p-type well contacting with side surfaces of said field oxide film and provided so as to surround a region directly under said fuse in said p-type semiconductor substrate, a bottom of said p-type well extends below a horizontal plane created by a lowest most surface of said field oxide film embedded in said p-type semiconductor substrate, and
said single n-type well and said p-type well are laterally spaced apart below the lowermost surface of the first insulating layer and so that only the p-type semiconductor substrate occupies the lateral space between said single n-type well and said p-type well.

8. The semiconductor device of claim 1, wherein, said single n-type well and said p-type well being laterally spaced apart from each other by a portion of said p-type semiconductor substrate located laterally between said single n-type well and said p-type well.

9. A semiconductor device comprising:
a p-type semiconductor substrate;
a field oxide film embedded in said p-type semiconductor substrate;
a fuse provided on said field oxide film;
a p-type well provided so as to surround a region directly under said fuse in said p-type semiconductor substrate and having a larger impurity concentration than an impurity concentration of said p-type semiconductor substrate, a bottom of said p-type well extends below a horizontal plane created by a lowest most surface of said field oxide film embedded in said p-type semiconductor substrate;
a first insulating layer and a second insulating layer in this order stacked over said p-type semiconductor substrate and said field oxide film;
a seal ring embedded in said first insulating layer and said second insulating layer so as to surround said fuse;
a single n-type well provided directly below said fuse in said p-type semiconductor substrate; and
an opening provided over said single n-type well so as to expose the first insulating layer, wherein said first insulating layer covers an upper surface of said fuse, wherein said p-type well is in contact with a lower surface of said seal ring, and said single n-type well and said p-type well being free of an impurity layer therebetween.

10. The semiconductor device according to claim 9, wherein said field oxide film is an element separation film embedded on an element formation surface side of said p-type semiconductor substrate.

11. The semiconductor device according to claim 9, wherein a top portion of said p-type well only comes into contact with said field oxide film on an outer periphery of said field oxide film.

12. The semiconductor device of claim 9, wherein, said single n-type well and said p-type well being laterally spaced apart from each other by a portion of said p-type semiconductor substrate located laterally between said single n-type well and said p-type well.

13. A semiconductor device comprising:
a n-type semiconductor substrate;
a field oxide film embedded in said n-type semiconductor substrate;
a fuse provided on said field oxide film;
a single n-type well provided directly below said fuse in said n-type semiconductor substrate and having a larger impurity concentration than an impurity concentration of said n-type semiconductor substrate, said single n-type well is provided only below a lowest most surface of the field oxide film and completely within a vertical boundary defined by each end of said field oxide film;
a p-type well provided in such a manner as to surround a region directly under said fuse in said n-type semiconductor substrate;
a first insulating layer and a second insulating layer in this order stacked over said n-type semiconductor substrate and said field oxide film;
a seal ring embedded in said first insulating layer and said second insulating layer so as to surround said fuse; and
an opening provided over said single n-type well so as to expose said first insulating layer, wherein said first insulating layer covers an upper surface of said fuse, wherein said p-type well is in contact with a lower surface of said seal ring, and said single n-type well and said p-type well being free of an impurity layer therebetween.

14. The semiconductor device according to claim 13, wherein said single n-type well is in contact with a lower surface of said field oxide film.

15. The semiconductor device according to claim 13, wherein said field oxide film is an element separation film embedded on an element formation surface side of said n-type semiconductor substrate.

16. The semiconductor device according to claim 13, wherein said field oxide film is a single insulating layer.

17. The semiconductor device according to claim 16, wherein said single insulating layer is comprised of a $SiO_2$ film.

18. The semiconductor device according to claim 13, wherein said p-type well and said single n-type well extend to a same depth in said n-type semiconductor substrate.

19. The semiconductor device of claim 13, wherein,
the fuse has an overall elongated structure with two ends with an interconnection connected to each end of each fuse, the fuse made of a film shaped to have a narrow midsection configured to be melted by laser irradiation to disconnect the interconnections, the p-type well contacting with side surfaces of said field oxide film and provided so as to surround a region directly under said fuse in said n-type semiconductor substrate, a bottom of said p-type well extends below a horizontal plane created by a lowest most surface of said field oxide film embedded in said n-type semiconductor substrate, and said single n-type well and said p-type well are laterally spaced apart below the lowermost surface of the first insulating layer and so that only the n-type semiconductor substrate occupies the lateral space between said single n-type well and said p-type well.

20. The semiconductor device of claim 13, wherein, said single n-type well and said p-type well being laterally spaced apart from each other by a portion of said n-type semiconductor substrate located laterally between said single n-type well and said p-type well.

* * * * *